US008717215B2

(12) United States Patent
Dai (10) Patent No.: US 8,717,215 B2
(45) Date of Patent: May 6, 2014

(54) METHOD AND APPARATUS FOR IMPROVING THE PERFORMANCE OF A DAC SWITCH ARRAY (75) Inventor: Dai Dai, Carlsbad, CA (US)

(73) Assignee: Tensorcom, Inc., Carlsbad, CA (US)

(*) Notice: Subject to any disclaimer, the term of this patent is extended or adjusted under 35 U.S.C. 154(b) by 83 days.

(21) Appl. No.: 13/474,743

(22) Filed: May 18, 2012

(65) Prior Publication Data
US 2013/0307614 A1  Nov. 21, 2013

(51) Int. Cl.
*H03M 1/78* (2006.01)
(52) U.S. Cl.
USPC ............................... 341/154; 341/153
(58) Field of Classification Search
USPC .......... 341/154, 153, 144, 145, 158, 159, 150
See application file for complete search history.

(56) References Cited

U.S. PATENT DOCUMENTS 5,604,501 A    2/1997  McPartland
5,764,174 A    6/1998  Dempsey
7,830,291 B2 * 11/2010 Wikner ........................ 341/155
2006/0232450 A1* 10/2006 Hashido et al. ............... 341/50
2007/0126689 A1    6/2007  Ishii
2011/0241920 A1* 10/2011 Mori ............................ 341/153

FOREIGN PATENT DOCUMENTS

JP    09-186598    7/1997
JP    10-107635    4/1998

OTHER PUBLICATIONS

47 CFR § Operation within the band 57-64 GHz.

* cited by examiner

*Primary Examiner* — Joseph Lauture
(74) *Attorney, Agent, or Firm* — Thaddeus Gabara; Tyrean Patent Prosecution Law Firm (57) ABSTRACT One of the critical design parameters occurs when a digital signal is converted into an analog signal. As the supply voltage drops to less than 2 times of threshold voltage to reduce leakage and save power, generating a relative large swing with a resistor-ladder DAC becomes more difficult. For a 5 bit DAC, 32 sub-arrays are used to select the appropriate voltage from the series coupled resistor network. Each sub-array uses p-channel transistors where the sub-array extracting the lowest voltage 700 mV only has a 100 mV of gate to source voltage. To compensate for the reduced gate to source voltage, the sub-arrays are partitioned into four groups. In each group, the p-channel width is increased from 2 um to 5 um, as the tap voltage drops from 1.2 V to 0.7 V. This allows the p-channel transistor with a small gate to source voltage to have a larger width thereby improving performance.

19 Claims, 9 Drawing Sheets

| | * voltage | Conv. Width (microns) | Inc. width (microns) | Group width (microns) |
|---|---|---|---|---|
| 4-31 | 1.103 | 5 | 1.9 | 2 |
| 4-30 | 1.090 | 5 | 5-30δ | 2 |
| 4-29 | 1.077 | 5 | 5-29δ | 2 |
| 4-28 | 1.064 | 5 | 5-28δ | 2 |
| 4-27 | 1.051 | 5 | 5-27δ | 2 |
| 4-26 | 1.038 | 5 | 5-26δ | 2 |
| 4-25 | 1.025 | 5 | 5-25δ | 2 |
| 4-24 | 1.012 | 5 | 5-24δ | 2 |
| 4-23 | 0.999 | 5 | 5-23δ | 3 |
| 4-22 | 0.986 | 5 | 5-22δ | 3 |
| 4-21 | 0.973 | 5 | 5-21δ | 3 |
| 4-20 | 0.960 | 5 | 5-20δ | 3 |
| 4-19 | 0.947 | 5 | 5-19δ | 3 |
| 4-18 | 0.934 | 5 | 5-18δ | 3 |
| 4-17 | 0.921 | 5 | 5-17δ | 3 |
| 4-16 | 0.908 | 5 | 5-16δ | 3 |
| 4-15 | 0.895 | 5 | 5-15δ | 4 |

5-2

| | * voltage | Conv. Width (microns) | Inc. width (microns) | Group width (microns) |
|---|---|---|---|---|
| 4-14 | 0.882 | 5 | 5-14δ | 4 |
| 4-13 | 0.869 | 5 | 5-13δ | 4 |
| 4-12 | 0.856 | 5 | 5-12δ | 4 |
| 4-11 | 0.843 | 5 | 5-11δ | 4 |
| 4-10 | 0.830 | 5 | 5-10δ | 4 |
| 4-9 | 0.817 | 5 | 5-9δ | 4 |
| 4-8 | 0.804 | 5 | 5-8δ | 4 |
| 4-7 | 0.791 | 5 | 5-7δ | 5 |
| 4-6 | 0.778 | 5 | 5-6δ | 5 |
| 4-5 | 0.765 | 5 | 5-5δ | 5 |
| 4-4 | 0.752 | 5 | 5-4δ | 5 |
| 4-3 | 0.739 | 5 | 5-3δ | 5 |
| 4-2 | 0.726 | 5 | 5-2δ | 5 |
| 4-1 | 0.713 | 5 | 5-δ | 5 |
| 4-0 | 0.700 | 5 | 5 | 5 |

\* Adjustable current source can shift voltage

δ = 0.1 microns

METHOD AND APPARATUS FOR IMPROVING THE PERFORMANCE OF A DAC SWITCH ARRAY

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs. Since WiGig transceivers use DAC (Digital to Analog Converters), the reduced power supply impacts the performance of the DAC's.

CMOS (Complementary Metal Oxide Semiconductor) is the primary technology used to construct integrated circuits. N-channel transistors and P-channel transistors (MOS transistor) are used in this technology which uses fine line technology to consistently reduce the channel length of the MOS transistors. Current channel lengths examples are 40 nm, the power supply of VDD equals 1.2 V and the number of layers of metal levels can be 8 or more. This technology typically scales with technology.

CMOS technology delivers a designer with the ability to form very large system level design on one die known as a System On a Chip (SOC). The SOC are complex systems with millions, if not billions, of transistors which contain analog circuits and digital circuits. The analog circuits operate purely analog, the digital circuits operate purely digital and these two circuits types can be combined together to form circuits operating in a mixed-signal.

For example, digital circuits in their basic form only use digital logic and some examples can be a component comprising at least one; processor, memory, control logic, digital I/O circuit, reconfigurable logic and/or hardware programmed that to operate as hardware emulator. Analog circuits in their basic form only use only analog circuits and some examples can be a component comprising at least one; amplifier, oscillator, mixer, and/or filter. Mixed signal in their basic form only use both digital and analog circuits and some examples can be a component comprising at least one: DAC (Digital to Analog Convertor), Analog to Digital Converter (ADC), Power Supply control, Phase Lock Loop (PLL), and/or transistor behavior control over Process, Voltage and Temperature (PVT). The combination of digital logic components with analog circuit components can appear to behave like mixed signal circuits; furthermore, these examples that have been provided are not exhaustive as one knowledgeable in the arts understands.

Transceivers comprise at least one transmitter and at least one receiver and are used to interface to other transceivers in a communication system. One version of the transmitter can comprise at least one of each: DAC, LPF (Low Pass Filter), mixer, local oscillator, power amplifier and interface port that are coupled forming a RF (Radio Frequency) transmit chain. One version of the receiver can comprise at least one of each: interface port, LNA (Low Noise Amplifier), mixer, BB (Base Band) amplifier, LPF and ADC that are coupled forming a RF receive chain. Furthermore, each RF transmit and receive chains can operate on an in-phase (I) signal and the quadrature- phase (Q) signal simultaneously.

One of the critical design parameters of a transceiver occurs when a digital signal is converted into an analog signal. As the supply voltage drops to less than 2 times of threshold voltage to reduce leakage and save power, it becomes more and more difficult to provide a relative large swing with a resistor-ladder DAC, since both n-channel MOS transistors and p-channel MOS transistors exhibit large on-resistance to reference voltage close to mid-Vdd, which dramatically increases the settling time and necessitates a large switch size. Also, the mid-Vdd tap itself often has a higher resistance path to supply line, which exacerbates the situation.

When driving an n-channel transistor directly (DC coupling), it is desirable to have a higher reference voltage for the DAC to ensure proper operation of the next stage. The n-channel transistor in a complementary switch becomes more challenging. Nevertheless, p-channel transistor suffers from even higher on-resistance. Simulation shows that even a 10 um/40 nm PMOS shows an on-resistance of approximately 500 $\Omega$ when trying to deliver 0.7 V reference voltage with 1.2 V supply.

Such issues have become more serious as the number of bits of the DAC increases. For example, a 5-bit DAC requires 32 switches connected to the same output node, in which situation the combined drain parasitic capacitance of the switches, instead of the input capacitance of the following stage, often dominates the node capacitance. In this case, the settling time of DAC no longer benefits from larger switch sizes. Another solution is required to overcome this problem.

BRIEF SUMMARY OF THE INVENTION

As the power supply voltage reduces in the scaling of integrated circuits, the voltage headroom for analog integrated circuits decreases correspondingly. This makes the design of high performance DAC systems in a low power supply integrated circuit much more challenging. Since each switch delivers a fixed voltage, the DAC dynamic performance is often evaluated by the maximum settling time regardless of the specific voltage level. Therefore, the same switch width for all voltage taps in the series coupled resistor network is not required.

In this embodiment, a tapered-switch width structure for a resistor ladder DAC is described. The p-channel transistor width is increased from 2 um to 5 um, in 4 consecutive groups to minimize layout concerns, as the tap voltage in the series coupled resistor network drops from 1.2 V to 0.7 V. Such structure minimizes the maximum settling time by keeping the switch parasitic capacitance minimum while maintaining relatively low on-resistance. This implementation proved to be very effective in simulation. A DAC with tapered switches settles within 0.1 LSB 50 pS faster than DAC with uniform-sized switches using a conventional implementation. A 50 pS improvement can have a profound advantage in a DAC operating at a clock rate of 2.64 GHz since the clock cycle time is only ~380 pS.

Another one of the embodiments of the disclosure is to incorporate other variations in the width increasing from 2 um to 5 um as the tap voltage in the series coupled resistor network drops from 1.2V to 0.7V. For example, the width can increase linearly or exponentially. The linear method can provide another 10% improvement.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

Another embodiment of one of the present inventions is an apparatus comprising: a plurality of resistors coupled in a series resistor network; a first end of the series coupled resistor network; a second end of the series coupled resistor network; and at least one transistor coupled to each tap of the series coupled resistor network; whereby the transistors coupled to the taps from the first end to the second end increases in channel width, further comprising: a first power supply coupled to the first end; an adjustable current source coupled to the second end; and a second power supply coupled to the adjustable current source, whereby the first power supply is VDD; the second power supply is VSS; and the transistors are p-channel transistors, whereby the first power supply is VSS; the second power supply is VDD; and the transistors are n-channel transistors, further comprising: a first decoder to enable the transistors for Q signal voltages; and a second decoder to enable the transistors for I signal voltages, wherein the Q signal voltages includes a Q compliment voltage, and the I signal voltages includes an I compliment voltage, further comprising: a first differential isolation buffer couples the Q signal voltages to a Q filter; and a second differential isolation buffer couples the I signal voltages to an I filter; whereby the isolation buffer provides a constant output impedance to the filter regardless of an output impedance exhibited at the tap of the series coupled resistor network.

Another embodiment of one of the present inventions is an apparatus comprising: a plurality of resistors coupled in a series resistor network; a first end of the series coupled resistor network; a second end of the series coupled resistor network; at least one transistor coupled to each tap of the series coupled resistor network; and the transistors coupled to the taps from the first end to the second end are combined into several consecutive groups; whereby the channel width of transistors in the groups increase from the first end to the second end, further comprising: a first power supply coupled to the first end; an adjustable current source coupled to the second end; and a second power supply coupled to the adjustable current source, whereby the first power supply is VDD; the second power supply is VSS; and the transistors are p-channel transistors, whereby the first power supply is VSS; the second power supply is VDD; and the transistors are n-channel transistors, further comprising: a first decoder to enable the transistors for Q signal voltages; and a second decoder to enable the transistors for I signal voltages, wherein the Q signal voltages includes a Q compliment voltage, and the I signal voltages includes an I compliment voltage, further comprising: a first differential isolation buffer couples the Q signal voltages to a Q filter; and a second differential isolation buffer couples the I signal voltages to an I filter; whereby the isolation buffer provides a constant output impedance to the filter regardless of an output impedance exhibited at the tap of the series coupled resistor network.

Another embodiment of one of the present inventions is a method of minimizing DAC (Digital to Analog Converter) delay comprising the steps of: coupling a plurality of resistors coupled in a series resistor network; coupling a first power supply to a first end of the series coupled resistor network; coupling a second power supply to a second end of the series coupled resistor network; coupling at least one transistor to each tap of the series coupled resistor network; partitioning the transistors coupled to the taps from the first end to the second end into groups; and combining the transistors from the first end to the second end into several consecutive groups; whereby the channel width of the transistors of the groups increase from the first end to the second end, further comprising the steps of: coupling a first power supply to the first end; coupling an adjustable current source to the second end; and coupling a second power supply to the adjustable current source, whereby the first power supply is VDD; the second power supply is VSS; and the transistors are p-channel transistors, whereby the first power supply is VSS; the second power supply is VDD; and the transistors are n-channel transistors, further comprising the steps of: enabling the transistors with a first decoder to generate Q signal voltages; and enabling the transistors with a second decoder to generate I signal voltages, further comprising the steps of: including the compliment voltage of the Q signal voltages, and including the compliment voltage of the I signal voltages.

DETAILED DESCRIPTION OF THE INVENTION

The inventions presented in this specification can be used in any wired or wireless system, low power supply voltage design. The techniques are applicable to any DAC design.

Figure 1:
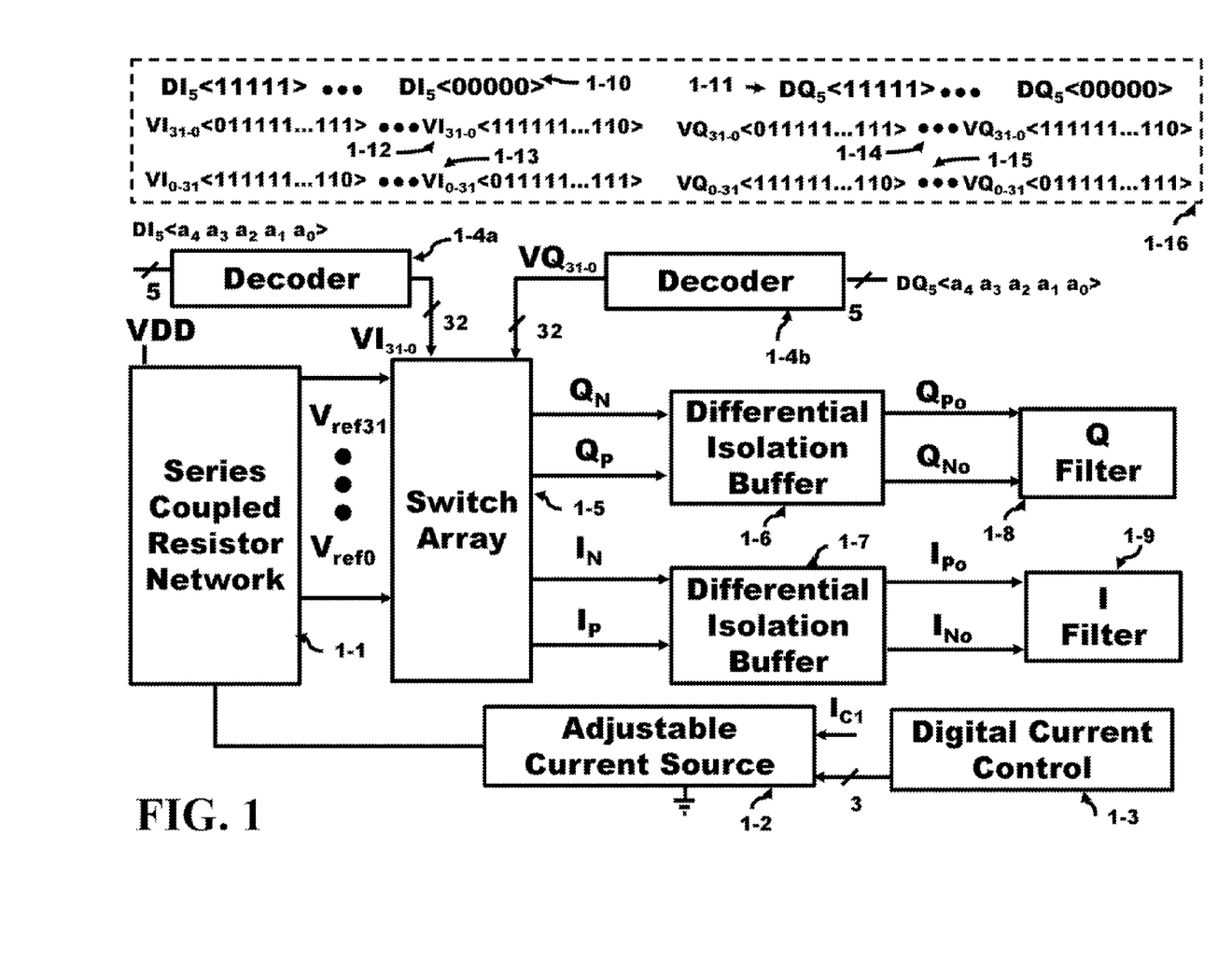
FIG. 1 depicts a block diagram of the series coupled resistor network, switch array, isolation buffer feeding the filter in accordance with the present invention.

FIG. 1 illustrates a block diagram of the D/A converter and how the DAC output is applied to the I and Q filters. The two decoders 1-4a and 1-4b translate a 5 bit input into 32 bit patterns but the decoders could also be designed to operate on a 3 bit, 4 bit or other bit value input. At the top left is a decoder 1-4a receiving a five bit digital input for the I portion. The digital bits are $DI_5<a_4, a_3, a_2, a_1, a_0>$ providing 32 combinations. At the top right is a second decoder 1-4b receiving an additional five bit digital input for the Q portion. The digital bits are $DQ_5<a_4, a_3, a_2, a_1, a_0>$ providing 32 combinations. Examples of these strings are provided in box 1-16. The corresponding words for the input digital values $DI_5<11111>$ and $DI_5<00000>$ for $VI_{31-0}$ is shown as 1-12 while corresponding words for the input digital values $DQ_5<11111>$ and $DQ_5<00000>$ for $VQ_{31-0}$ is shown as 1-14. When $DI_5$ is $DI_5<11111>$ as shown on the left hand side of 1-10, the value of $VI_{31-0}$ is shown on the left hand side of 1-12 while the value of $VI_{0-31}$ is depicted on the left hand side of 1-13. Note that $VI_{0-31}$ has the reverse bit sequence of $VI_{31-0}$. When $DQ_5$ is $DQ_5<00000>$ as shown on the right hand side of 1-14, the value of $VQ_{31-0}$ is shown on the right hand side of 1-14 while the value of $VQ_{0-31}$ is depicted on the right hand side of 1-15. Note that $VQ_{0-31}$ has the reverse bit sequence of $VQ_{31-0}$. The $DI_5< >$ values are independent of the $DQ_5< >$ values. Both 32-bit words are applied to the switching array 1-5. Internal to the switch array 1-5, the words $VI_{0-31}$ 1-13 corresponding to $VI_{31-0}$ 1-12 are extracted. Similarly, internal to the switch array 1-5, the words $VQ_{0-31}$ 1-15 corresponding to $VQ_{31-0}$ 1-14 are extracted. The switching array comprises 32 sub-arrays. The bits are applied to the sub-array according to position. Each sub-array contains four p-channel transistors. For example, the 31th bit is applied to the top sub-array and the corresponding drains of the four transistors are coupled to the top tap of the series coupled resistor network 1-1. The 0th bit is applied to the lowest sub-array and the corresponding drains of the four transistors are coupled to the bottom tap of the series coupled resistor network 1-1. Each bit of these four 32 bit words $VI_{31-0}$, $VI_{0-31}$, $VQ_{3-10}$ and $VQ_{0-31}$ is applied to one of the four transistors in each sub-array. For the five input digital sequence $DI_5<11111>$ 1-10, $VI_{31-0}$ 1-12 with the leading 0 enables one transistor in the top array, while $VI_{0-31}$ 1-13 with the trailing 0 enables one transistor in the lowest array. For the five input digital sequence $DQ_5<00000>$ 1-11, $VQ_{31-0}$ 1-14 with the trailing 0 enables one transistor in the lowest array, while $VQ_{0-31}$ 1-15 with the leading 0 enables one transistor in the top array. These enabled transistors transfer the voltage from the series coupled resistor network 1-1 to one of the four outputs $Q_p I_p$, $Q_n$ and $I_n$. Similarly, for the five input digital sequence $DI_5<00000>$ 1-10, $VI_{31-0}$ 1-12 with the trailing 0 enables one transistor in the bottom array, while $VI_{0-31}$ 1-13 with a leading 0 enables one transistor in the top array. For the five input digital sequence $DQ_5<11111>$ 1-11, $VQ_{31-0}$ 1-14 with the leading 0 enables one transistor in the top array, while $VQ_{0-31}$ 1-15 with the trailing 0 enables one transistor in the lowest array. These enabled transistors transfer the voltage from the series coupled resistor network 1-1 to one of the four outputs $Q_p$, $I_p$, $Q_n$ and $I_n$. In this latter case, the output voltages on $Q_p$, $I_p$, $Q_n$ and $I_n$ are inverted from the first case.

The voltage that is supplied to the switching array is provided by the series coupled resistor network 1-1 which has 32 outputs and is coupled at a first end to VDD and is coupled at a second end to an adjustable current source 1-2. The adjustable current source 1-2 is controlled by a digital current control 1-3 and an analog reference current $I_{c1}$ and is coupled to VSS.

The series coupled resistor network 1-1 has 32 voltage outputs ranging from $V_{ref0}$ to $V_{ref31}$. The voltage range is extended approximately from 700 mV to 1.1 V in equal increments, respectively. The current source can be adjusted to shift the values of the voltages up or down. After the switch array 1-5, only four voltages $Q_p$, $I_p$, $Q_n$ and $I_n$ are generated where the $Q_p$ and $Q_n$ are provided to the Q differential isolation buffer 1-6 and the $I_p$ and $I_n$ are provided to the I differential isolation buffer 1-7. The outputs of the Q differential isolation buffer 1-6 generates the Q filter voltages while the outputs of the I differential isolation buffer 1-7 generates the I filter voltages. The Q filter 1-8 and I filter 1-9 have an input impedance consisting of both capacitive and resistive components. The isolation buffer is required to provide constant output impedance to the filter regardless of the output impedance exhibited by the resistive network of the switch array 1-5 and meanwhile to isolate the switch array 1-5 from the input impedance of the filter. For an example of a filter, U.S. patent application Ser. No. 13/243,880, "Differential Source Follower having 6 dB Gain with Applications to WiGig Baseband Filters," filed on Sep. 23, 2011 and commonly assigned herewith, disclose certain subject matter which is common hereto and describes a filter, suitable for filtering a wideband signal and is incorporated herein by reference.

Figure 2A:
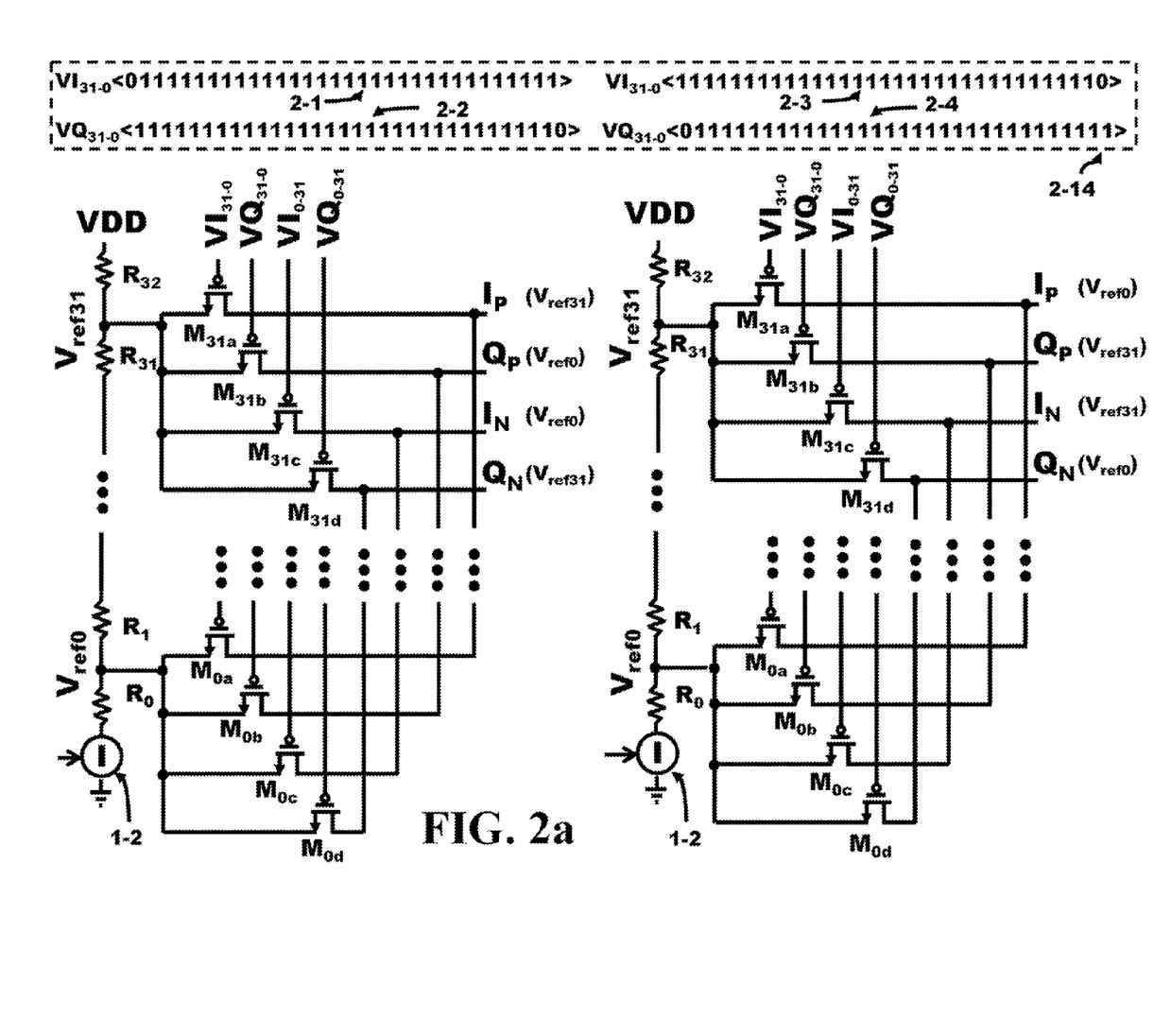
FIG. 2a illustrates a series coupled resistor network and switch array with two different decoder patterns in accordance with the present invention.

In FIG. 2a, the dashed box 2-14 contains four 32-bit digital words. On the left, word $VI_{31-0}$ 2-1 is generated by the decoder when $DI_5<11111>$ and $VQ_{31-0}$ 2-2 is generated by the decoder when $DQ_5<00000>$. On the right, word $VI_{31-0}$ 2-3 is generated by the decoder when $DI_5<00000>$ and $VQ_{31-0}$ 2-4 is generated by the decoder when $DQ_5<11111>$. The series coupled resistor network is shown from top to bottom beginning from VDD down to the adjustable current source 1-2 that is coupled to ground. In between, the current source and VDD are 33 resistors labeled $R_0$ to $R_{32}$. The lowest position tap is between $R_0$ and $R_1$ providing a voltage $V_{ref0}$. The highest positioned tap is between $R_{31}$ and $R_{32}$ providing the voltage $V_{ref31}$. All the voltage taps are coupled to a sub-array comprising four p-channel transistors. The source of these four transistor are coupled together while the drain of each transistor is coupled to $Q_p$, $I_p$, $Q_n$ and $I_n$, respectively. All $Q_p$ outputs of the sub-arrays are connected together, all $I_p$ outputs of the sub-arrays are connected together, all $I_n$ outputs of the sub-arrays are connected together and all $Q_n$ outputs of the sub-arrays are connected together. Thus, the capacitive load of the drains on each these four outputs is 32 times that of a single transistor. Each bit of $VI_{31-0}$ is coupled to one p-channel gate of the sub-array controlling $I_p$. Each bit of $VQ_{31-0}$ is coupled to one p-channel gate of the sub-array controlling $Q_p$. The word $VI_{0-31}$ is extracted from $VI_{31-0}$ 2-1 and is coupled to one p-channel gate of the sub-array controlling $I_n$. The word $VQ_{0-31}$ is extracted from $VQ_{31-0}$ 2-2 and is coupled to one p-channel gate of the sub-array controlling $Q_n$. The bit position of $VI_{31-0}$, $VQ_{31-0}$ $VI_{0-31}$ and $VQ_{0-31}$ indicates the corresponding position of the sub-array that these bits control. Thus, the 0 in $VI_{31-0}$ 2-1 at the 31th position is applied to $M_{31a}$, the 0 in $VQ_{31-0}$ 2-2 at the 0th position is applied to $M_{0b}$, the 0 in $VI_{0-31}$ at the 0th position is applied to $M_{0c}$ and the 0 in $VQ_{0-31}$ at the 31th position is applied to $M_{31d}$. All of the 1's disable the corresponding p-channels in the remaining sub-arrays. The outputs $I_p$ and $Q_n$ provide a voltage of $V_{ref31}$ while the outputs $I_n$ and $Q_p$ provide the compliment voltage of $V_{ref0}$.

When $VI_{31-0}$ 2-3 and $VQ_{31-0}$ 2-4 shown in dashed box 2-14 are applied to the sub-arrays, the 0 in $VI_{31-0}$ 2-3 at the 0th position is applied to $M_{0a}$ enabling the transistors. The 0 in $VQ_{31-0}$ 2-3 at the 31th position is applied to $M_{31b}$, the 0 in $VI_{0-31}$ at the 31th position is applied to $M_{31c}$ and the 0 in $VQ_{0-31}$ at the 0th position is applied to $M_{0d}$. All of the 1's disable the corresponding p-channels in the remaining sub-arrays. The outputs $I_p$ and $Q_n$ provide a voltage of $V_{ref0}$ while the outputs $I_n$ and $Q_p$ provide the compliment voltage of $V_{ref31}$. This is the inverted value of the previous case in FIG. 2a. Although $VI_{31-0}$ is independent of $VQ_{31-0}$, they are dependent in this discussion to easily allow the description of the diagrams.

Figure 2B:
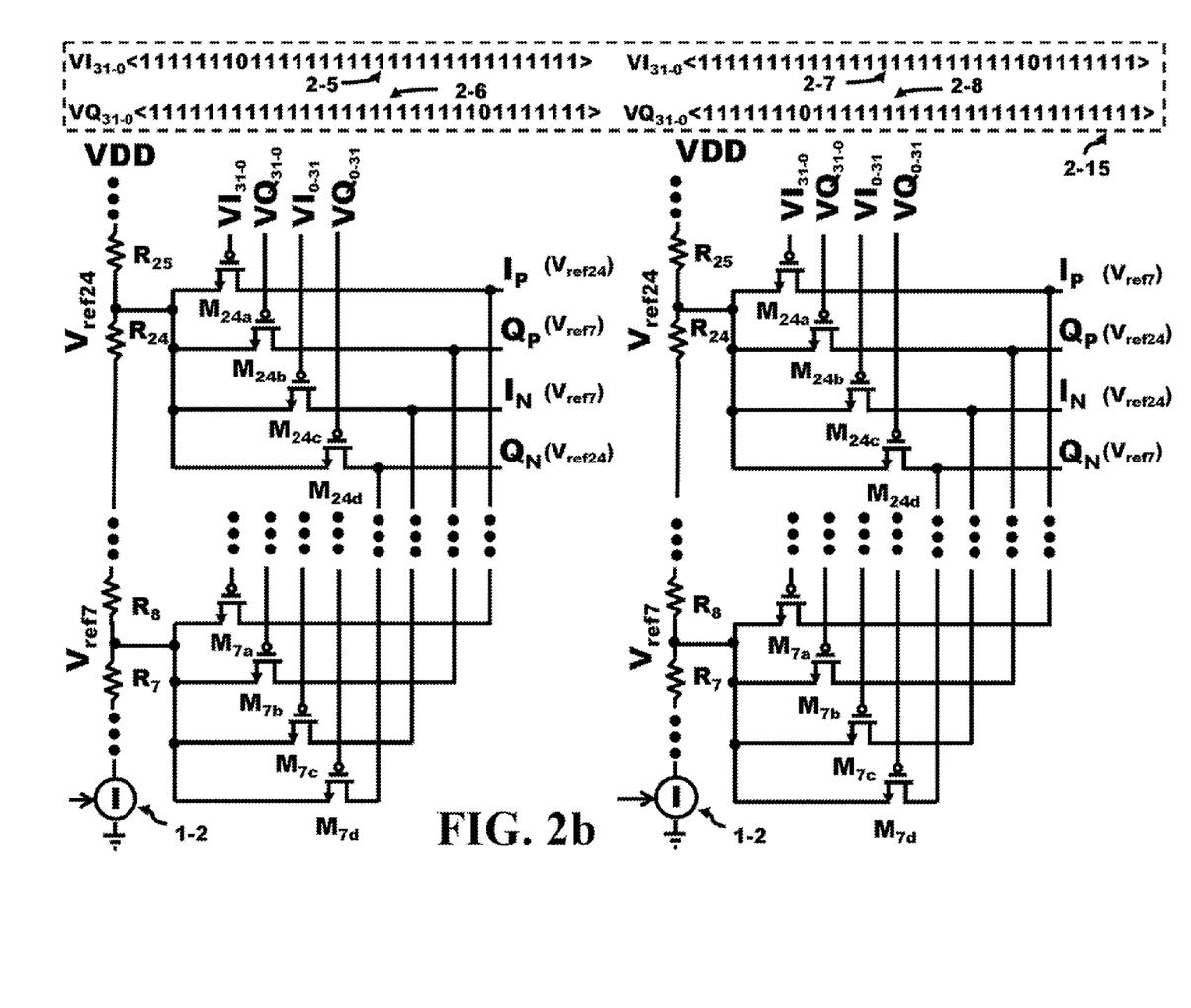
FIG. 2b illustrates a series coupled resistor network and switch array with another two different decoder patterns in accordance with the present invention.

In FIG. 2b, the dashed box 2-15 contains four 32-bit digital values. On the left, word $VI_{31-0}$ 2-5 is generated by the decoder when $DI_5$<11000> and $VQ_{31-0}$ 2-6 is generated by the decoder when $DQ_5$<00111>. On the right, word $VI_{31-0}$ 2-7 is generated by the decoder when $DI_5$<00111> and $VQ_{31-0}$ 2-8 is generated by the decoder when $DQ_5$<11000>. The 0 in $VI_{31-0}$ 2-5 at the 24th position is applied to $M_{24a}$, the 0 in $VQ_{31-0}$ 2-6 at the 7th position is applied to $M_{7b}$, the 0 in $VI_{0-31}$ at the 7th position is applied to $M_{7c}$ and the 0 in $VQ_{0-31}$ at the 24th position is applied to $M_{24d}$. This enables four transistors. The leading and trailing 1's disable the corresponding p-channels in the remaining sub-arrays. The outputs $I_p$ and $Q_n$ provide a voltage of $V_{ref24}$ while the outputs $I_n$ and $Q_p$ provide the compliment voltage of $V_{ref7}$.

When $VI_{31-0}$ 2-7 and $VQ_{0-31}$ 2-8 shown in dashed box 2-15 are applied to the sub-arrays, the 0 in $VI_{31-0}$ 2-7 at the 7th position is applied to $M_{7a}$, the 0 in $VQ_{31-0}$ 2-8 at the 24th position is applied to $M_{24b}$, the 0 in $VI_{0-31}$ at the 24th position is applied to $M_{24c}$ and the 0 in $VQ_{0-31}$ at the 7th position is applied to $M_{7d}$. The leading and trailing 1's disable the corresponding p-channels in the remaining sub-arrays. The outputs $I_p$ and $Q_n$ provide a voltage of $V_{ref7}$ while the outputs $I_n$ and $Q_p$ provide the compliment voltage of $V_{ref24}$. This is the inverted value of the previous case in FIG. 2b.

Figure 2C:
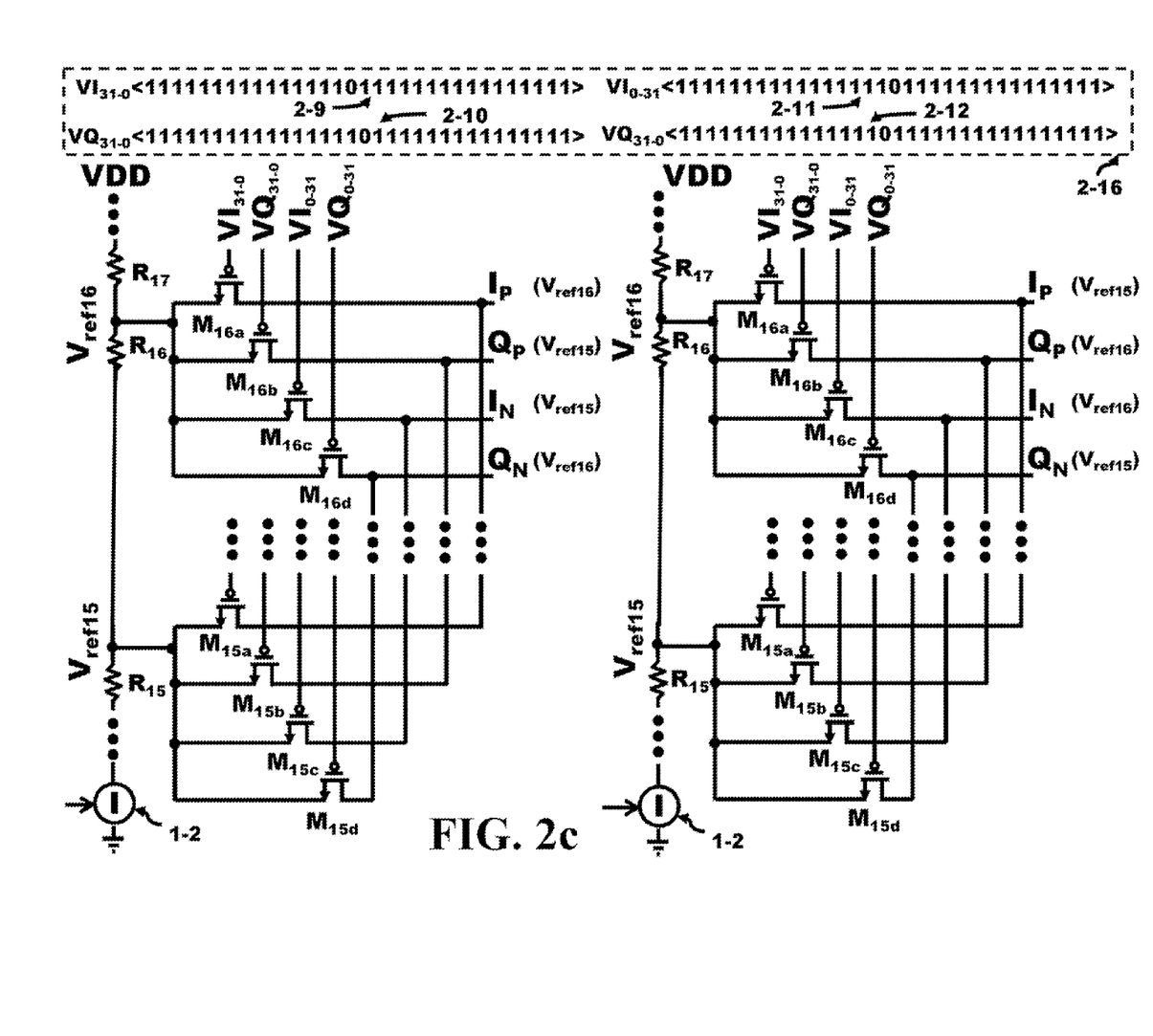
FIG. 2c shows a series coupled resistor network and switch array with yet another two different decoder patterns in accordance with the present invention.

In FIG. 3b, the dashed box 2-16 contains four 32-bit digital values. On the left, word $VI_{31-0}$ 2-9 is generated by the decoder when $DI_5$<10000> and $VQ_{31-0}$ 2-10 is generated by the decoder when $DQ_5$<01111>. On the right, word $VI_{31-0}$ 2-11 is generated by the decoder when $DI_5$<01111> and $VQ_{31-0}$ 2-12 is generated by the decoder when $DQ_5$<10000>. The 0 in $VI_{31-0}$ 2-9 at the 16th position is applied to $M_{16a}$, the 0 in $VQ_{31-0}$ 2-10 at the 15th position is applied to $M_{15b}$, the 0 in $VI_{0-31}$ at the 15th position is applied to $M_{15c}$ and the 0 in $VQ_{0-31}$ at the 16th position is applied to $M_{16d}$. This enables four transistors. The leading and trailing 1's disable the corresponding p-channels in the remaining sub-arrays. The outputs $I_p$ and $Q_n$ provide a voltage of $V_{ref16}$ while the outputs $I_n$ and $Q_p$ provide the compliment voltage of $V_{ref15}$.

When $VI_{31-0}$ 2-11 and $VQ_{0-31}$ 2-12 shown in dashed box 2-16 are applied to the sub-arrays, the 0 in $VI_{31-0}$ 2-11 at the 15th position is applied to $M_{15a}$, the 0 in $VQ_{31-0}$ 2-12 at the 16th position is applied to $M_{16b}$, the 0 in $VI_{0-31}$ at the 16th position is applied to $M_{16c}$ and the 0 in $VQ_{0-31}$ at the 15th position is applied to $M_{15d}$. The leading and trailing 1's disable the corresponding p-channels in the remaining sub-arrays. The outputs $I_p$ and $Q_n$ provide a voltage of $V_{ref15}$ while the outputs $I_n$ and $Q_p$ provide the compliment voltage of $V_{ref16}$. This is the inverted value of the previous case in FIG. 2c.

Figure 3A:
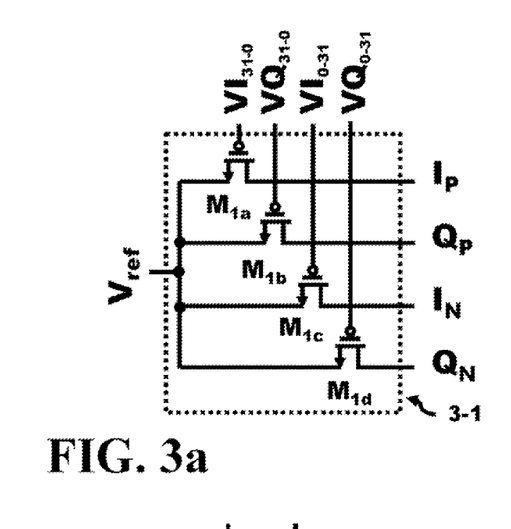
FIG. 3a presents a single switch sub-array in accordance with the present invention.

In FIG. 3a, a sub-array is illustrated which consists of four p-channel transistors $M_{1a}$, $M_{1b}$, $M_{1c}$ and $M_{1d}$. The first 32-bit word $VI_{31-0}$ can enable $M_{1a}$, $VQ_{31-0}$ can enable $M_{1b}$, $VI_{0-31}$ can enable $M_{1c}$ and $VQ_{0-31}$ can enable $M_{1d}$. The drains of the p-channels are coupled to $I_p$, $Q_p$, $I_n$ and $Q_n$ as illustrated in block 3-1. The sources of all four p-channels transistors are connected together and coupled to $V_{ref}$.

Figure 3B:
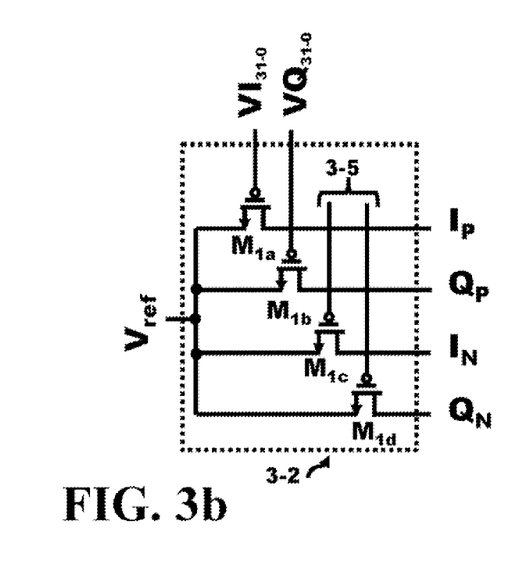
FIG. 3b depicts a single switch sub-array with a simplification of inputs in accordance with the present invention.
Figure 3C:
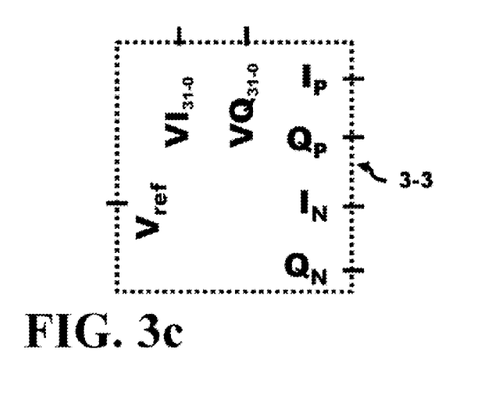
FIG. 3c illustrates an equivalent dotted box representation with labels in accordance with the present invention.
Figure 3D:
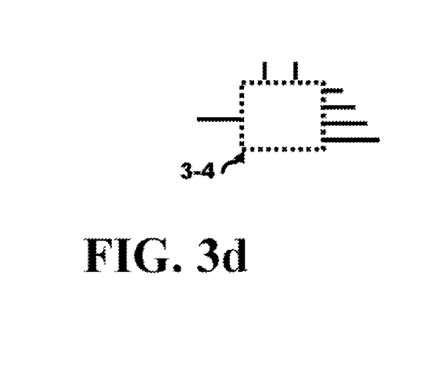
FIG. 3d shows an equivalent dotted box representation without labels in accordance with the present invention.

In FIG. 3b, the two 32-bit words $VI_{0-31}$ and $VQ_{0-31}$ are extracted from $VI_{31-0}$ and $VQ_{31-0}$, respectively, and are labeled as 3-5 otherwise the circuit is identical to that shown in the dotted box 3-1. FIG. 3c shows the dotted box 3-3 with the outputs labeled according to the dotted box 3-2. Finally, the last representation of one of the switching elements is illustrated as 3-4 in FIG. 3d. The inputs and outputs are not labeled but a positional correspondence to the values or names exists and is related to the dotted block 3-3 of FIG. 3c. The block 3-4 will be used to construct the full 32 bit series string and switching array.

Figure 4:
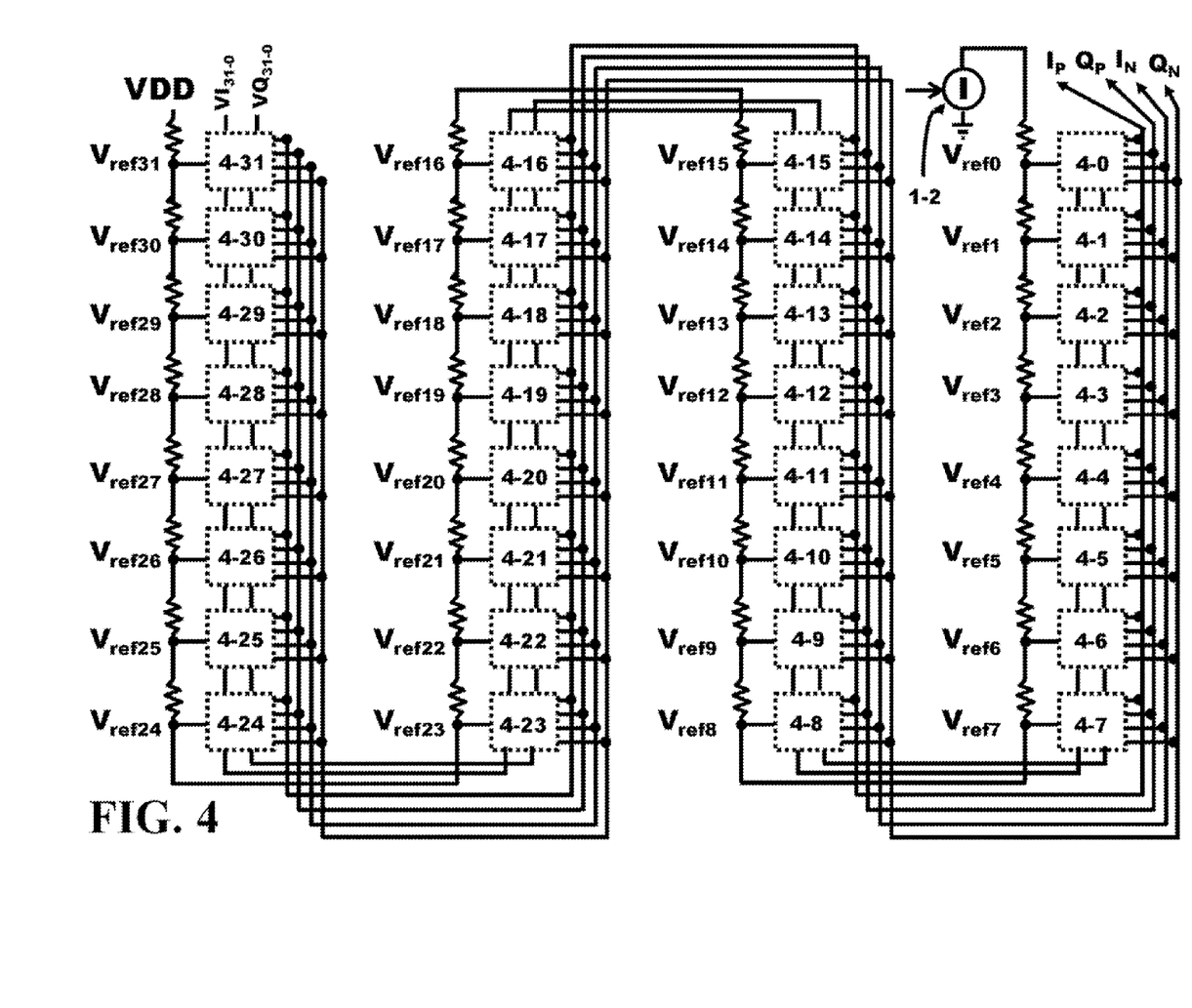
FIG. 4 illustrates the equivalent box representation and series coupled resistor network of a 32 output DAC in accordance with the present invention.

FIG. 4 illustrates the series coupled resistor network and the sub-switching array elements using the block 3-4. The series coupled resistor network is between VDD and the adjustable current source 1-2. The 33 resistors provide 32 voltage tap points ranging from $V_{ref31}$ down to $V_{ref0}$. The magnitude of the largest voltage applied to $V_{ref31}$ is approximately 1.1V while the magnitude of the smallest voltage applied to $V_{ref0}$ is approximately 0.7V. Each of the $I_p$, $Q_p$, $I_n$ and $Q_n$ nodes of the switching array elements 4-0 through 4-31 are connected together and provided as outputs of the switch array as illustrated in the upper right-hand side of FIG. 4. Since each output is connected together, each output has a large drain capacitance load as mentioned earlier. This capacitance increases the delay propagation of the switching network. Furthermore, since the sub-arrays are coupled to different points of the series coupled resistor network, each string is provided a different voltage. Since the sub-arrays are constructed with p-channel transistors, these different voltages provide a source voltage for these p-channels that is dependent on the tap of the series coupled resistor network. When a 0 is applied to the gate of these p-channels, the transistor has an impedance of:

$$R_{on} = \frac{1}{\mu C_{ox} \frac{W}{L}(V_{GS} - V_{TH})} \quad \text{(Equ. 1)}$$

where, $C_{ox}$ is the gate capacitance, W is the channel width and L is the channel length of the transistor, $V_{GS}$ is the gate to source voltage (dependent on the tap to the series coupled resistor network) and $V_{TH}$ is the threshold voltage (about 0.6V). As $V_{GS}$ decreases, the resistance $R_{on}$ increases.

For example, $V_{ref31}$ provides the sub-array 4-31 with a voltage of about 1.1V which is the source voltage for the p-channel transistors. Thus, $V_{GS}$-$V_{TH}$ is about 0.5V. However, at the bottom of the series coupled resistor network, $V_{ref0}$, a voltage of about 0.7V is applied to the source of the p-channel transistors. In this case, $V_{GS}$-$V_{TH}$ is only about 0.1 V which increase the resistance significantly and increases the propagation delay. Conventionally, the width of all p-channels transistors in all sub-arrays are the same.

The invention aspect of the embodiment is to taper the widths of the p-channel transistors as a function of the tap point to the series coupled resistor network. The width of the p-channels can be smaller near the top of the series coupled resistor network ($V_{ref31}$) and increase in size as the tap moves down to the bottom of the series coupled resistor network ($V_{ref0}$). As Equ. 1 indicates, as $V_{GS}$-$V_{TH}$ decreases, an increased width W can be used to compensate for the decrease in source voltage.

Figure 5:
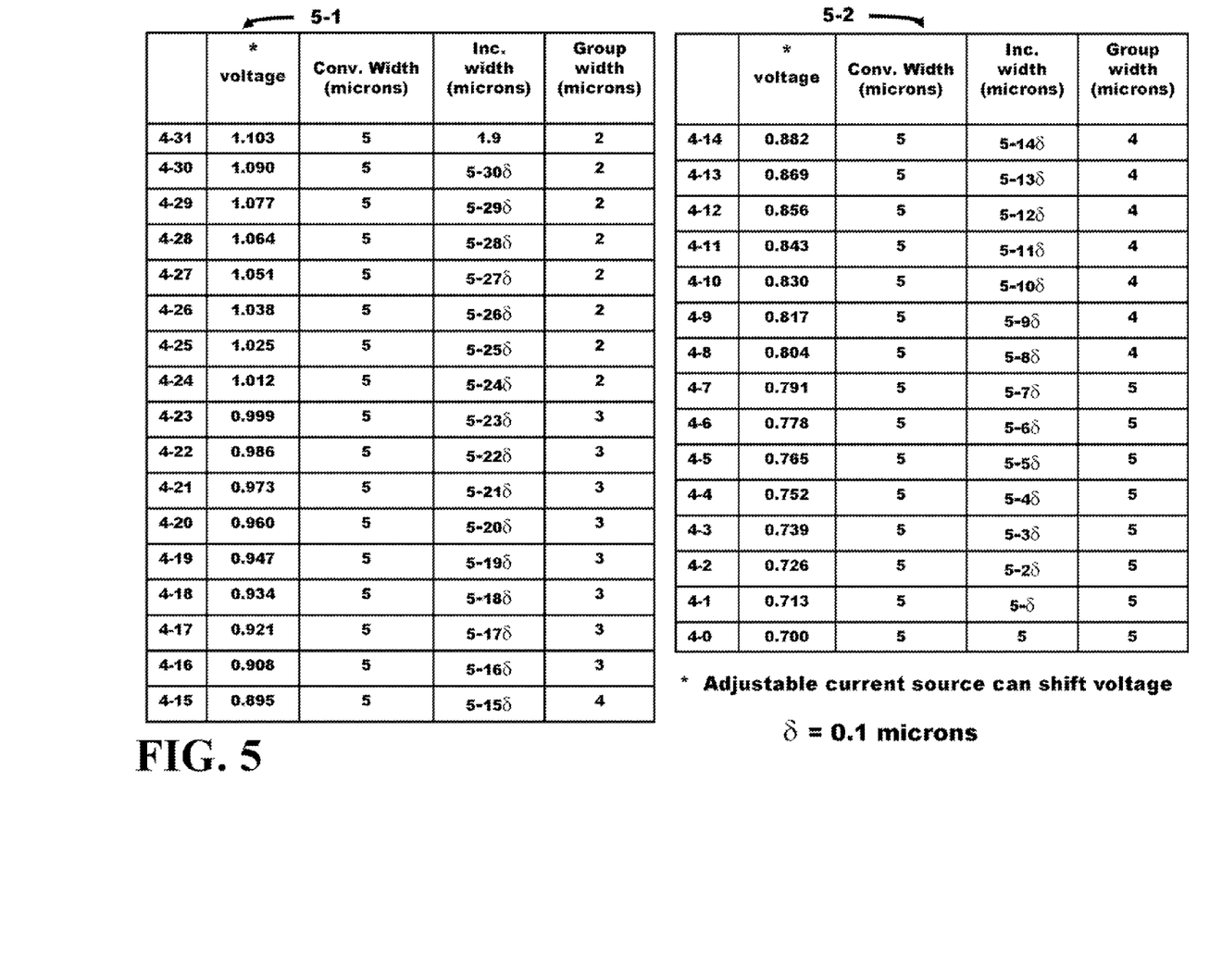
FIG. 5 shows a table illustrating the conventional width, linear width and the group width of transistors sizes in the switch array in accordance with the present invention.

In FIG. 5, tables 5-1 and (continuation) 5-2 illustrate the sub-array corresponding to FIG. 4 (first column), $V_{ref}$ voltage of the series coupled resistor network tap points (second column) and width of the conventional technique (third column). In addition, the fourth and fifth columns provide the inventive techniques of linear and group adjustments of the p-channel transistor widths of each sub-array. The voltage that is applied to each of these switching array elements is indicated in the second column and this voltage is an adjustable voltage because of the current source that is located at the lower end of the string can be controlled both through digital means as well as an analog control to adjust the voltage as required. Basically, the voltage varies from 1.103 V (4-31) down to 0.7 V (4-0). In the sub-array corresponding to 4-0, a p-channel transistor with a drain voltage of 700 mV having a threshold voltage of 600 mV leaves the p-channel transistor being overdriven with a gate voltage of 100 mV. In a conventional switching array, all of the widths of the P-channel transistor would be 5 μm as indicated in the third column. The innovative feature of the embodiment in this invention corresponds to the fourth and fifth columns. The width is adjusted linearly in the fourth column according to the position in the switching array. The width of the p-channels vary from 1.9 μm as illustrated in the row 4-31 and increase linearly in width increments of 0.1 μm all the way down to the lowest row of 4-0 where the transistor is 5μm wide. Although the sub-array 4-0 has a smaller source voltage causing the gate to source to be only 100 mV, the larger width p-channel transistor decreases the resistance of the transistor thereby improving the performance. In addition, since the transistors have a width less than the conventional design, the overall capacitance loading the node is deceased thereby improving the performance due to a decreased capacitive load. The fifth column illustrates the case where the transistors are grouped into four groups. The uppermost group ranges from row 4-31 to 24-24 have a p-channel width of 2 μm. For rows 4-23 to 4-16, all of the transistors in the switching away elements are 3 μm wide. From 4-15 down to 4-8 all of the transistors of the p-channel transistors are 4 μm wide and finally from 4-7 to 4-0, the p-channel transistors are all 5 μm wide. Thus, as the series coupled resistor network approaches 7 V the width of the transistor increases providing greater performance.

Figure 6A:
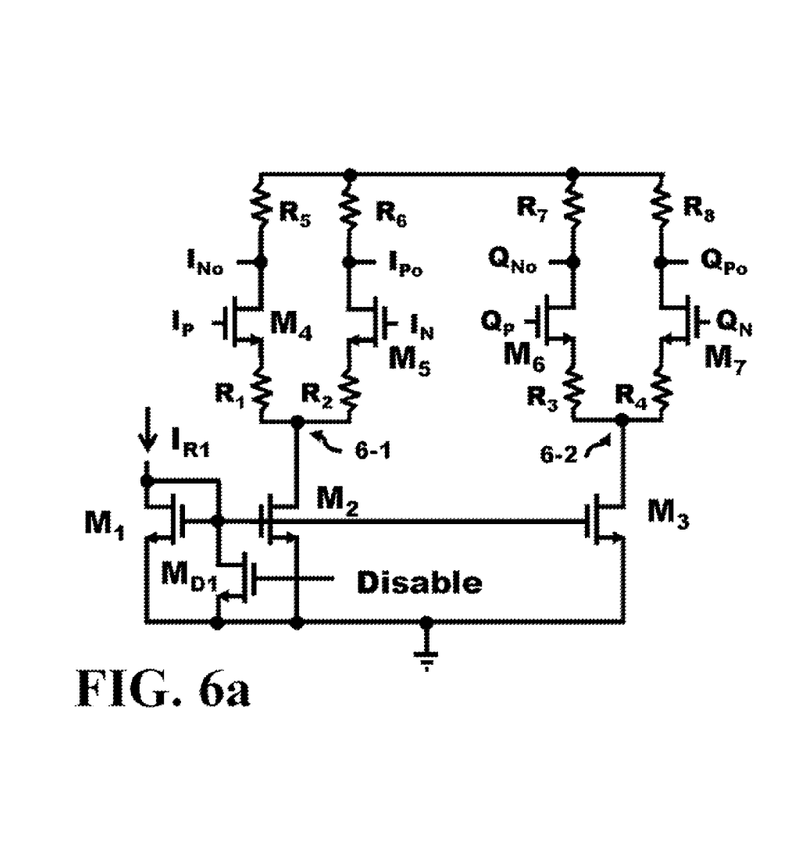
FIG. 6a presents the differential isolation buffer in accordance with the present invention.

FIG. 6a illustrates the differential isolation buffer which prevents the resistive load of the filter from impacting the series coupled resistor network network. A current source driven by $I_{R1}$ is applied to transistor M1 which mirrors the current into $M_2$ and $M_4$. At the drain of $M_2$ 6-1 a differential circuit comprising a resistors $R_1$, $R_2$, $R_5$ and $R_6$, as well as, transistors $M_4$ and $M_5$ are used to isolate the input $I_p$ and $I_n$ nodes from the output $I_{no}$ and $I_{po}$. At the drain of $M_3$ 6-2 is a similar circuit consisting of resistors $R_3$, $R_4$, $R_7$ and $R_8$. There are also to transistors $M_6$ and $M_7$ driven by $Q_p$ and $Q_n$, respectively. The output is $Q_{no}$ and $Q_{po}$ drive the filter components thereby isolating any impedance from the filter from making an impact on the series string network.

Figure 6B:
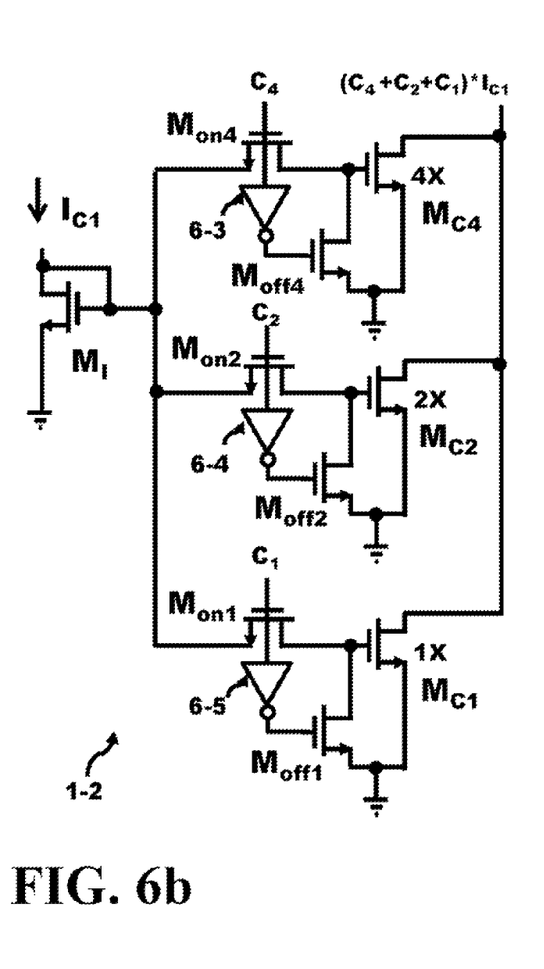
FIG. 6b presents the adjustable current source controlled by a reference current and digital adjustment values in accordance with the present invention.

The adjustable current source is illustrated in FIG. 6b. A reference current $I_{C1}$ is applied to transistor M1. This current is mirrored in transistors $M_{C4}$, $M_{C2}$ and $M_{C1}$. The digital values $C_4$, $C_2$ and $C_1$ enable or disable the current source $M_{C4}$, $M_{C2}$ and $M_{C1}$, respectively. The transistor $M_{C2}$ is twice the width of $M_{C1}$ and $M_{C4}$ is four times the width of $M_{C1}$. This current source can adjust the value of the current digitally in increments of 1× from 1× all the way up to 7×. Thus, this adjustable current source is controlled digitally, as well as, being analog controlled by the reference current $I_{C1}$.

Figure 7A:
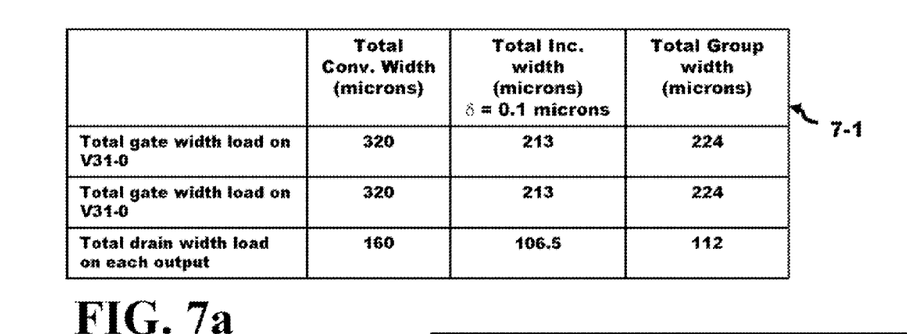
FIG. 7a shows a table depicting the total width on the input and output nodes of the conventional, linear and group switch array in accordance with the present invention.

The table 7-1 in FIG. 7a has three rows: summation of the total gate width load on $V_{31-0}$, summation of the total gate width load on $V_{0-31}$ and total drain width load on each output, $I_p$, $Q_p$, $I_n$ and $Q_n$. The last row gives the total drain width on each output which highlights the advantage of the inventive embodiments over the conventional technique. In the conventional technique, the total drain width loading each of the four outputs is 160 μm. The next column (where the Delta is 0.1 μm) shows the total drain width is 106.5 μm providing a significant decrease in capacitance loading down each output node. The last column (width divided into four groups) shows the total drain width as 112 μm. This is slightly more than the previous column, but allows the p-channel transistors to have a more uniform layout. The first and second rows provide the total gate capacitance presented by the sub-arrays to the pre-driver circuit. Less gate width would decrease the power dissipation, since less capacitance needs to be driven. Both the linear (213 μm) and group (224 μm) techniques have a lower gate total gate width when compared to the conventional (320 μm) technique.

Figure 7B:
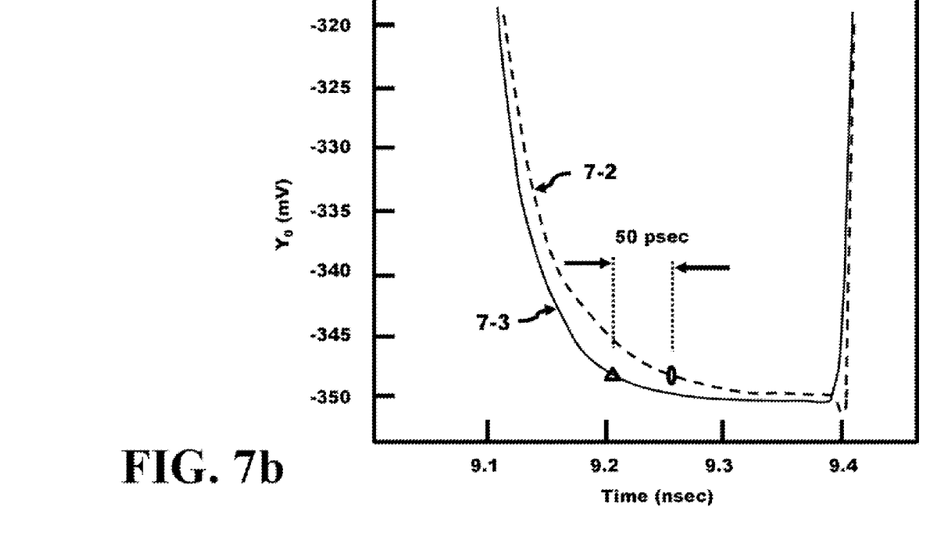
FIG. 7b presents a plot indicating a 50 pS improvement of the group array technique over the conventional array technique in accordance with the present invention.

The techniques of the second and third column were used in the simulation to determine the performance improvement and are illustrated in FIG. 7b. The conventional plot versus time is illustrated as curve 7-2 where a vertical oval is placed at −348 mV. The corresponding result when the group technique is used is illustrated as curve 7-3 where a triangle is placed at −348 mV. Between these two points one can see that the dividing the sub-arrays into four equal width groups achieves a 50 pS performance improvement.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. For example, the circuits have a Doctrine of Equivalents, that is, p-channels transformed into n-channels, VDD interchanges with VSS, voltages measured with respect to the other power supply, the position of current sources moved to the other power supply, etc. Although the circuits were described using CMOS, the same circuit techniques can be applied to depletion mode transistors and BJT or biploar circuits, since this tecnology allows the formation of current sources and source folloowers. When a transistor is specified, the transistor can be a transistor such as an N-MOS or P-MOS. The CMOS or SOI (Silicon on Insulator) technology provides two enhancement mode channel types: N-MOS (n-channel) and P-MOS (p-channel) transistors or transistors. In addition, a network and a portable system can exchange information wirelessly by using communication techniques such as TDMA (Time Division Multiple Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. An apparatus comprising:
a plurality of resistors coupled in a series resistor network;
a first end of said series coupled resistor network;
a second end of said series coupled resistor network;
a plurality transistors coupled to each tap point of said series coupled resistor network; wherein
said plurality of transistors coupled to each said tap point from said first end to said second end increase in channel width;
a first power supply coupled to said first end;
an adjustable current source coupled to said second end; and
a second power supply coupled to said adjustable current source.

2. The apparatus of claim 1, wherein
said first power supply is VDD;
said second power supply is VSS; and
said plurality of transistors are p-channel transistors.

3. The apparatus of claim 1, wherein
said first power supply is VSS;
said second power supply is VDD; and
said plurality of transistors are n-channel transistors.

4. The apparatus of claim 1, further comprising:
a first decoder to enable a first plurality of said plurality of transistors for Q signal voltages; and
a second decoder to enable a remainder of said plurality of transistors for I signal voltages.

5. The apparatus of claim 4, wherein
said Q signal voltages includes a Q compliment voltage, and
said I signal voltages includes an I compliment voltage.

6. The apparatus of claim 5, further comprising:
a first differential isolation buffer couples said Q signal voltages to a Q filter; and
a second differential isolation buffer couples said I signal voltages to an I filter; wherein
said isolation buffers provide a constant output impedance to said filters regardless of an output impedance exhibited at said tap point of said series coupled resistor network.

7. An apparatus comprising:
a plurality of resistors coupled in a series resistor network;
a first end of said series coupled resistor network;
a second end of said series coupled resistor network;
a plurality of transistors coupled to each tap point of said series coupled resistor network; and
said plurality of transistors coupled to each said tap point from said first end to said second end are combined into several consecutive groups; wherein a transistor channel width in each said group increases from said first end to said second end.

8. The apparatus of claim 7, further comprising:
a first power supply coupled to said first end;
an adjustable current source coupled to said second end; and
a second power supply coupled to said adjustable current source.

9. The apparatus of claim 8, wherein
said first power supply is VDD;
said second power supply is VSS; and
said plurality of transistors are p-channel transistors.

10. The apparatus of claim 8, wherein
said first power supply is VSS;
said second power supply is VDD; and
said plurality of transistors are n-channel transistors.

11. The apparatus of claim 8, further comprising;
a first decoder to enable a first plurality of said plurality of transistors for Q signal voltages; and
a second decoder to enable a remainder of said plurality of transistors for I signal voltages.

12. The apparatus of claim 11, wherein
said Q signal voltages includes a Q compliment voltage, and
said I signal voltages includes an I compliment voltage.

13. The apparatus of claim 12, further comprising:
a first differential isolation buffer couples said Q signal voltages to a Q filter; and
a second differential isolation buffer couples said I signal voltages to an I filter; wherein
said isolation buffers provide a constant output impedance to said filters regardless of an output impedance exhibited at said tap point of said series coupled resistor network.

14. A method of minimizing DAC (Digital to Analog Converter) delay comprising the steps of:
coupling a plurality of resistors in a series resistor network;
coupling a first power supply to a first end of said series coupled resistor network;
coupling a second power supply to a second end of said series coupled resistor network;
coupling a plurality of transistors to each tap point of said series coupled resistor network; and
partitioning said plurality of transistors coupled to said tap points from said first end to said second end into several consecutive groups;
wherein a transistor channel width of each said group increases from said first end to said second end.

15. The method of claim 14, further comprising the steps of:
coupling a first power supply to said first end;
coupling an adjustable current source to said second end; and
coupling a second power supply to said adjustable current source.

16. The method of claim 14, wherein
said first power supply is VDD;
said second power supply is VSS; and
said plurality of transistors are p-channel transistors.

17. The method of claim 14, wherein
said first power supply is VSS;
said second power supply is VDD; and
said plurality of transistors are n-channel transistors.

18. The method of claim 14, further comprising the steps of:
enabling a first plurality of said plurality of transistors with a first decoder to generate Q signal voltages; and
enabling a remainder of said plurality of transistors with a second decoder to generate I signal voltages.

19. The method of claim 14, further comprising the steps of:
including the compliment voltage of said Q signal voltages, and
including the compliment voltage of said I signal voltages.

* * * * *